United States Patent
Lee et al.

(10) Patent No.: US 7,110,301 B2
(45) Date of Patent: Sep. 19, 2006

(54) NON-VOLATILE SEMICONDUCTOR MEMORY DEVICE AND MULTI-BLOCK ERASE METHOD THEREOF

(75) Inventors: Seok-Heon Lee, Gyeonggi-do (KR);
Young-Joon Choi, Gyeonggi-do (KR);
Tae-Gyun Kim, Gyeonggi-do (KR);
Dae-Sik Park, Gyeonggi-do (KR);
Jin-Yub Lee, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 10/982,247

(22) Filed: Nov. 3, 2004

(65) Prior Publication Data

US 2005/0248993 A1 Nov. 10, 2005

(30) Foreign Application Priority Data

May 7, 2004 (KR) ................ 10-2004-0032271
Sep. 13, 2004 (KR) ................ 10-2004-0073030

(51) Int. Cl.
*G11C 11/34* (2006.01)

(52) U.S. Cl. ................ 365/185.29; 365/185.22; 365/185.11

(58) Field of Classification Search ........... 365/185.29, 365/185.22, 185.11, 185.33, 230.06
See application file for complete search history.

(56) References Cited

U.S. PATENT DOCUMENTS

| | | | |
|---|---|---|---|
| 5,299,162 A | | 3/1994 | Kim et al. |
| 5,841,721 A | | 11/1998 | Kwon et al. |
| 5,999,446 A | | 12/1999 | Harari et al. |
| 6,084,803 A | * | 7/2000 | Sredanovic et al. ... 365/189.05 |
| 6,097,666 A | * | 8/2000 | Sakui et al. ........... 365/230.06 |
| 6,160,741 A | * | 12/2000 | Ueyama et al. ........ 365/185.33 |
| 7,003,621 B1 | * | 2/2006 | Koren et al. ................ 711/103 |
| 2002/0048191 A1 | * | 4/2002 | Ikehashi et al. ....... 365/185.22 |
| 2003/0117886 A1 | * | 6/2003 | Shiga et al. ................ 365/233 |

FOREIGN PATENT DOCUMENTS

| | | |
|---|---|---|
| JP | 08-306196 | 11/1996 |
| KR | 30974 | 6/2000 |
| KR | 48425 | 7/2000 |

OTHER PUBLICATIONS

English language abstract of Japanese Publication No. 08-306196.
English language abstract of Korean Publication No. 30974.
English language abstract of Korean Publication No. 48425.

* cited by examiner

*Primary Examiner*—Richard Elms
*Assistant Examiner*—Dang Nguyen
(74) *Attorney, Agent, or Firm*—Marger Johnson & McCollom, P.C.

(57) ABSTRACT

A non-volatile semiconductor memory device includes memory blocks and an erase controller configured to control a multi-block erase operation where at least two of the memory blocks are simultaneously erased. According to some embodiments, after selecting and simultaneously erasing the selected memory blocks, an erase verify operation for each of the erased memory blocks is performed according to an externally provided erase verify command and block address. According to some embodiments, if a suspend command is received by the memory device while selected memory blocks are being erased, the erase operation ceases and another operation, such as a read operation, begins. When a resume command is received by the memory device, the erase operation resumes. Other embodiments are described and claimed.

31 Claims, 8 Drawing Sheets

NON-VOLATILE SEMICONDUCTOR MEMORY DEVICE AND MULTI-BLOCK ERASE METHOD THEREOF

CROSS REFERENCE TO RELATED APPLICATIONS

This application claims priority from Korean Patent Application No. 2004-32271, filed on 7 May 2004, and from Korean Patent Application No. 2004-73030, filed on 13 Sep. 2004, the contents of which are hereby incorporated by reference in its entirety for all purposes.

BACKGROUND OF THE INVENTION

1. Field of the Invention

This disclosure relates to nonvolatile storage devices, and, in particular, to flash memory devices with an improved program algorithm, which is able to reduce program time.

2. Description of the Related Art

Semiconductor memories are usually considered to be the most vital microelectronic component of digital logic system design, such as computers and microprocessor-based applications ranging from satellites to consumer electronics. Therefore, advances in the fabrication of semiconductor memories including process enhancements and technology developments through the scaling for higher densities and faster speeds help establish performance standards for other digital logic families. Semiconductor memory devices may be characterized as either volatile random access memories (RAMs), or non-volatile memory devices. In RAMs, the logic information is stored either by setting up the logic state of a bistable flip-flop such as in a static random access memory (SRAM), or through the charging of a capacitor as in a dynamic random access memory (DRAM). In either case, the data is stored and can be read out as long as the power is applied, and the data is lost when the power is turned off; hence, they are called volatile memories.

Non-volatile memories, such as Mask Read-Only Memory (MROM), Programmable Read-Only Memory (PROM), Erasable Programmable Read-Only Memory (EPROM), and Electrically Erasable Programmable Read-Only Memory (EEPROM), are capable of storing the data, even with the power turned off. The non-volatile memory data storage mode may be permanent or reprogrammable, depending upon the fabrication technology used. Non-volatile memories are used for program and microcode storage in a wide variety of applications in the computer, avionics, telecommunications, and consumer electronics industries. A combination of single-chip volatile as well as non-volatile memory storage modes is also available in devices such as non-volatile SRAM (nvSRAM) for use in systems that require fast, programmable non-volatile memory. In addition, dozens of special memory architectures have evolved which contain some additional logic circuitry to optimize their performance for application-specific tasks.

In non-volatile memories, however, MROM, PROM, and EPROM are not free to be erased and written to by a system itself, so that it is not easy for general users to update stored contents. On the other hand, EEPROM is capable of electrically being erased or written. Application of the EEPROM is widened to an auxiliary memory or to system programming where continuous update is needed. In particular, a flash EEPROM (hereinafter, referred to as a flash memory) has a higher integration of degree than a conventional EEPROM and thus is advantageous to application to a large auxiliary memory.

A flash memory device includes a memory cell array that includes a number of memory blocks. A read/erase/program operation of respective memory blocks is made individually. The time required to erase memory blocks is a factor that limits the performance of a system that includes flash memory devices as well as a factor that limits the performance of the flash memory device itself.

To solve this drawback, a technique for simultaneously erasing a plurality of memory blocks is disclosed in U.S. Pat. No. 5,841,721 entitled "MULTI-BLOCK ERASE AND VERIFICATION CIRCUIT IN A NONVOLATILE SEMICONDUCTOR MEMORY DEVICE AND A METHOD THEREOF" and U.S. Pat. No. 5,999,446 entitled "MULTI-STATE FLASH EEPROM SYSTEM WITH SELECTIVE MULTI-SECTOR ERASE", which are herein incorporated by reference.

After simultaneously erasing a number of memory blocks, an erase verify operation is performed to judge whether the memory blocks have been normally erased. Such an erase verify operation is made with respect to each of simultaneously erased memory blocks. With the above references, the erase verify operation is carried out by storing address information of erased memory blocks in a memory device and referring to the stored address information. This means that a flash memory device requires separate control logic for controlling a multi-block erase verify operation and control signal lines related thereto. Accordingly, the erase verify operation of respective erased memory blocks is a factor that limits the performance and area of a flash memory device.

Embodiments of the invention address these and other disadvantages of the conventional art.

SUMMARY OF THE INVENTION

Some embodiments of the invention provide a non-volatile semiconductor memory device and its erase method which are capable of improving an erase verify operation in a multi-block erase method.

Some embodiments of the invention provide a non-volatile semiconductor memory device and its erase method which are capable of changing an erase time in a multi-block erase method.

Some embodiments of the invention provide a non-volatile semiconductor memory device capable of suspending a multi-block erase operation and performing a read/write operation.

BRIEF DESCRIPTION OF THE DRAWINGS

A more complete appreciation of the invention, and many of the attendant advantages thereof, will become readily apparent as embodiments of the invention become better understood by reference to the following detailed description when considered in conjunction with the accompanying drawings in which like reference symbols indicate the same or similar components.

DETAILED DESCRIPTION OF THE INVENTION

A non-volatile semiconductor memory device according to some embodiments of the invention provides a novel erase verify manner after simultaneously erasing a plurality of memory blocks. An erase verify operation of each of erased memory blocks may be carried out according to an erase verify command and a block address that are externally supplied. For example, to select a set of N erased memory blocks, N cycles of an erase command and a block address are externally provided, which will be more fully described below. Furthermore, according to some embodiments of the invention, a time required to simultaneously erase memory blocks is automatically varied according to the number of memory blocks to be erased, which will be more fully described blow.

Figure 1:
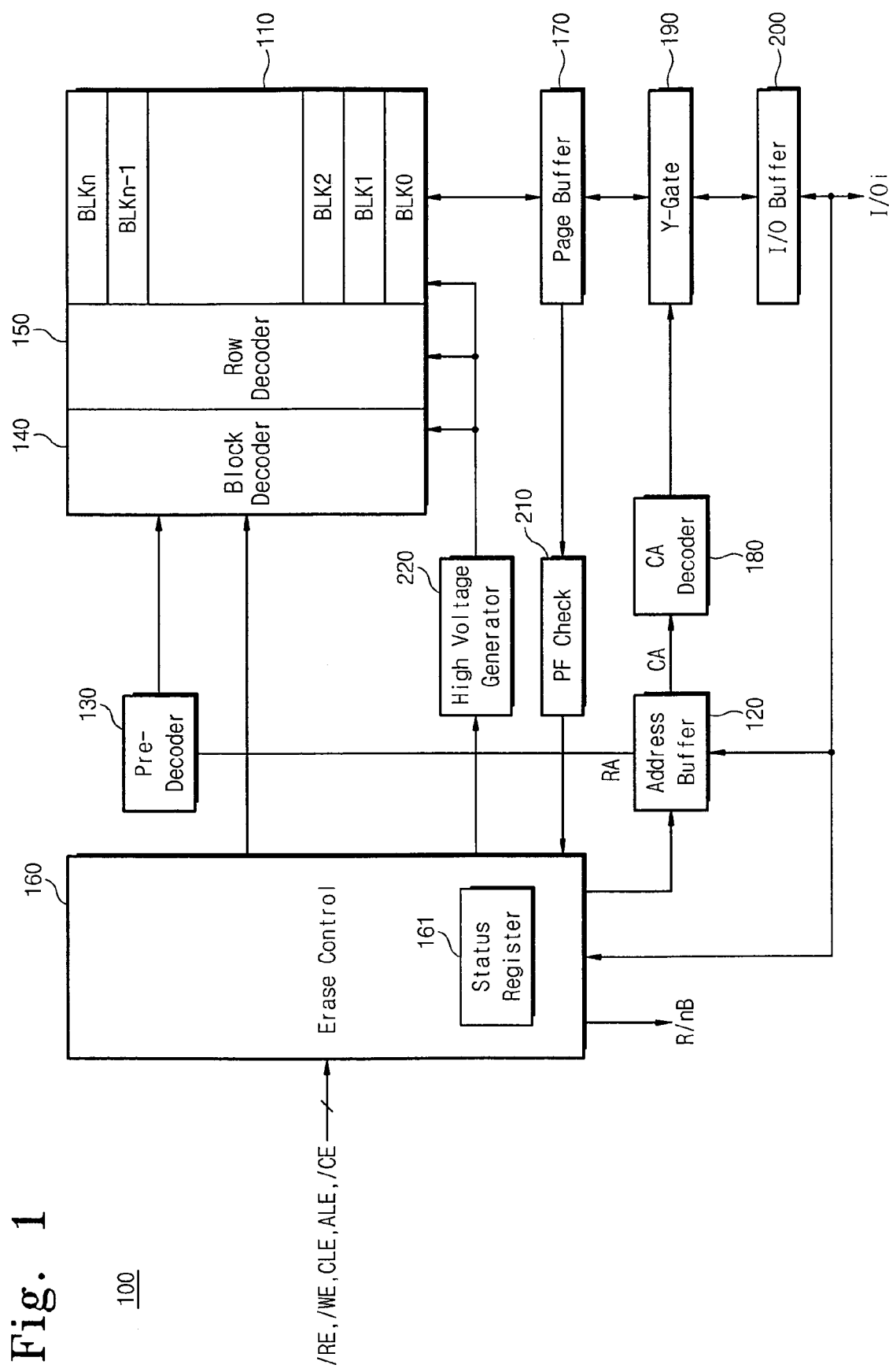
FIG. 1 is a schematic block diagram illustrating a non-volatile semiconductor memory device according to some embodiments of the invention.

FIG. 1 is a schematic block diagram illustrating a non-volatile semiconductor memory device according to some embodiments of the invention. The non-volatile semiconductor memory device illustrated in FIG. 1 is a NAND-type flash memory device, but it should be apparent that other embodiments of the invention may include other memory devices such as MROMs, PROMs, FRAMs, NOR-type flash memory devices, etc.

Referring to FIG. 1, the non-volatile semiconductor memory device 100 includes a memory cell array 110, which stores data information and has a plurality of memory blocks BLK0–BLKn. The non-volatile semiconductor memory device 100 further includes an address buffer circuit 120, a pre-decoder circuit 130, a block decoder circuit 140, a row decoder circuit 150, an erase controller circuit 160, a page buffer circuit 170, a column decoder circuit 180, a column gate circuit 190, an input/output buffer circuit 200, a pass/fail check circuit 210, and a high voltage generator circuit 220.

The address buffer circuit 120 is controlled by the erase controller circuit 160 and receives a column/row address via input/output pins I/Oi. The pre-decoder circuit 130 decodes a row address RA from the address buffer circuit 120 and outputs the decoded address signals to the block decoder circuit 140 and the row decoder circuit 150. The decoded address signals include block address information for selecting a memory block and page address information for selecting pages (or word lines) of the selected memory block. The block decoder circuit 140 is controlled by the erase controller circuit 160 and selects memory blocks in response to block address information from the pre-decoder circuit 130. In this embodiment, the block decoder circuit 140 is configured to store block address information of memory blocks to be erased according to the control of the erase controller circuit 160 at a multi-block erase mode, which will be more fully described below. The row decoder circuit 150 drives pages of a selected memory block with word line voltages from the high voltage generator circuit 220 according to modes of operation.

The page buffer circuit 170 includes a number of page buffers each connected to bit lines (shared by all memory blocks) and operates as a sense amplifier and as a write driver according to modes of operation. For example, the page buffer circuit 170 senses page data from a selected memory block via the bit lines at a read operation. During a program operation, the page buffer circuit 170 latches data to be programmed and drives the bit lines with a ground voltage or a power supply voltage, respectively. The column decoder circuit 180 decodes a column address from the address buffer circuit 120, and the column gate circuit 190 selects page buffers of the page buffer circuit 170 by a bit organization unit in response to decoded address signals from the column decoder circuit 180. During the read operation, data read by the page buffer circuit 170 is externally output through the column gate circuit 190 and the input/output buffer circuit 200. During the program operation, data to be programmed is transferred to the page buffer circuit 170 through the column gate circuit 190 and the input/output buffer circuit 200.

Although not shown in figures, the column decoder circuit 180 includes an address counter that sequentially increases an initial column address and successively generates column addresses. This means that page data that is to be read out or programmed is sequentially transferred through the column gate circuit 190 by the bit organization unit.

Still referring to FIG. 1, the pass/fail check circuit 210 receives page data bits read out by the page buffer circuit 170 during an erase verify operation, and determines whether the received page data bits have the same value (that is, a pass data bit). The pass/fail check circuit 210 outputs a judgment result to the erase controller circuit 160. The high voltage generator circuit 220 is controlled by the erase controller circuit 160 and generates word line voltages and a bulk voltage that are required at the multi-block erase operation and the erase verify operation. The word line voltages are transferred to pages (that is, word lines) of a selected memory block(s) through the row decoder circuit 150, and the bulk voltage is supplied to a bulk of the selected memory block(s).

The erase controller circuit 160 is configured to control a multi-block erase mode consisting of a multi-block erase period and an erase verify period. The erase controller circuit 160 judges an address/command/data input timing in response to control signals (e.g., CLE, ALE, /CE, /RE, /WE). The erase controller circuit 160 controls the block decoder circuit 140 in response to a multi-block select command so that block addresses of memory blocks to be erased in the multi-block erase period are sequentially stored in the block decoder circuit 140 through the address buffer circuit 120 and the pre-decoder circuit 130. The erase controller circuit 160 controls a multi-block erase operation in response to a multi-block erase command so that memory blocks of the received block addresses are erased at the same time. At the multi-block erase operation, pages of a selected memory block are set to a ground voltage and a bulk thereof is set to a high voltage (e.g., 20V). For example, at the multi-block erase operation, the erase controller circuit 160 controls the block decoder circuit 140 and the high voltage generator circuit 220 so that memory blocks are selected according to the stored block addresses and so that pages of each of the selected memory blocks are set to the ground voltage and a bulk thereof is set to the high voltage (e.g., 20V). After the multi-block erase operation is carried out, the erase controller circuit 160 controls an erase verify operation of each of the erased memory blocks in response to an erase verify command and a block address that are externally supplied. That is, the erase verify operation of each erased memory block is made in response to the external erase verify command and the external block address. This will be described more fully below.

As described above, the erase verify operation of the non-volatile semiconductor memory device 100 is performed on the basis of the externally supplied erase verify command and the block address. In other words, N cycles of an erase verify command and a block address are received externally to select a set of N erased memory blocks.

Figure 2:
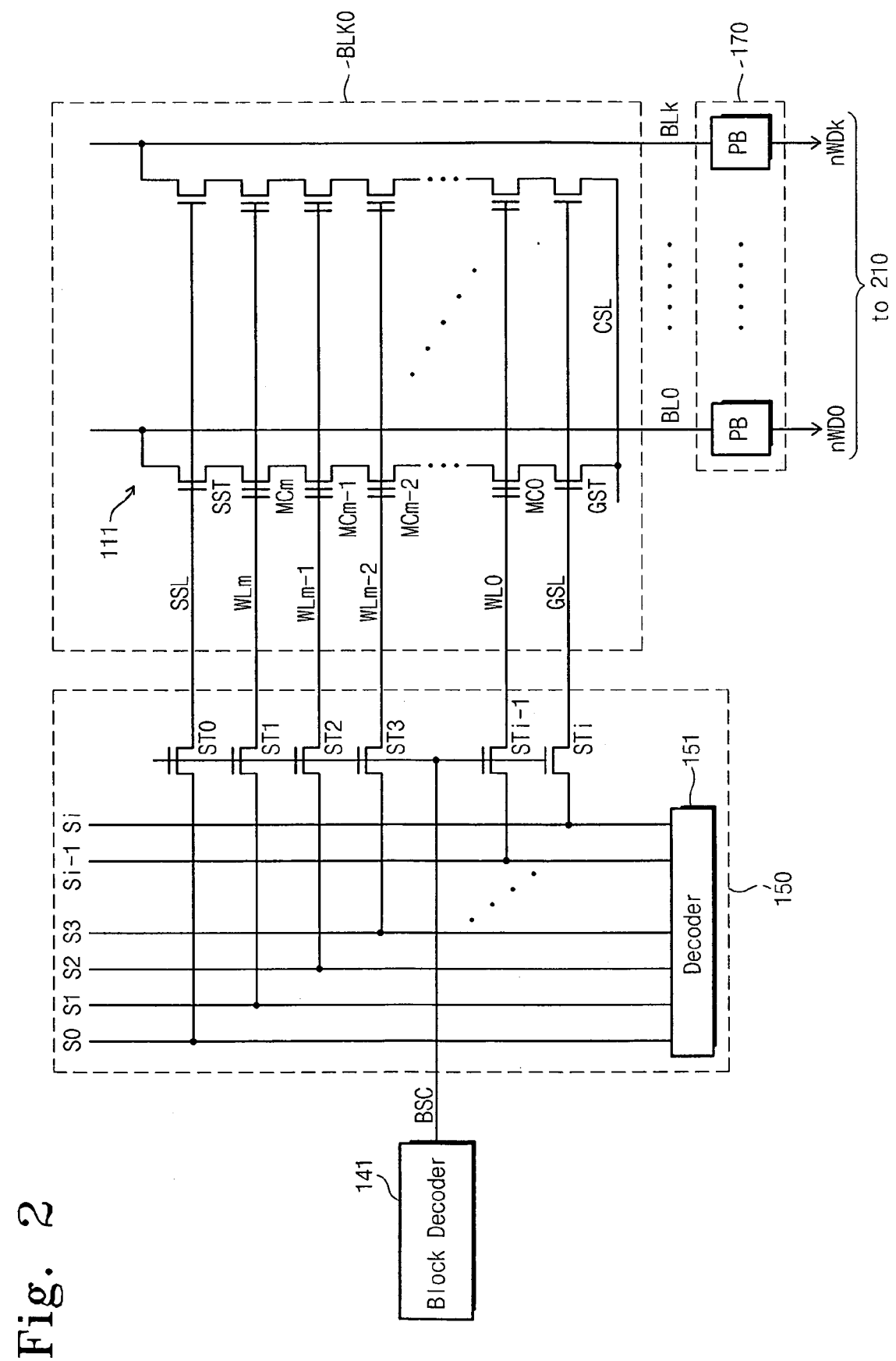
FIG. 2 is a schematic block diagram illustrating an example row decoder circuit, an example block decoder circuit, and an example page buffer circuit suitable for use with the device of FIG. 1.

FIG. 2 is a schematic block diagram illustrating an example row decoder circuit, an example block decoder circuit, and an example page buffer circuit suitable for use with the device of FIG. 1.

Referring to FIG. 2, a memory block BLK0 includes a number of strings 111, each of which includes a string select transistor SST, a ground select transistor GST, and a number of memory cells (or memory cell transistors) MC0–MCm connected in series between the select transistors SST and GST. The strings 111 are electrically connected to corresponding bit lines BL0–BLk, respectively. The bit lines BL0–BLk are arranged to be shared by memory blocks BLK0–BLKn of the memory cell array 110. In each string 111, a gate of the string select transistor SST is connected to a string select line SSL, a gate of the ground select transistors GST is connected to a ground select line GSL, and the gates of the memory cell transistors MCm–MC0 are connected to corresponding word lines WLm–WL0, respectively.

The string select line SSL, the word lines WLm–WL0, and the ground select line GSL are electrically connected to corresponding select lines S0–Si through the select transistors ST0–STi. In the multi-block erase period, for example, the select lines S0 and Si are floated, and the select lines S1–Si-1 are set to the ground voltage. The select transistors ST0–STi constitute the row decoder circuit 150, which further includes a decoder circuit 151 for transferring corresponding voltages (supplied from the high voltage generator circuit in FIG. 1) to the select lines S0–Si in response to the page address information from the pre-decoder circuit 130.

Gates of the select transistors ST0–STi are commonly connected to a block select line BSC, which is controlled by a block decoder 141. The block decoder 141 is controlled by the erase controller circuit 160 and activates or inactivates the block select line BSC in response to the block address information. The page buffer circuit 170 includes page buffers PB which are each connected to a respective bit line BL0–BLk and output data values nWD0–nWDk that are read at the erase verify operation to the pass/fail check circuit 210 in FIG. 1. The data values are utilized to judge whether an erase operation of a memory block is normally performed. Exemplary page buffer and pass/fail check circuits are disclosed in U.S. Pat. No. 5,299,162 entitled "NONVOLATILE SEMICONDUCTOR MEMORY DEVICE AND AN OPTIMIZING PROGRAMMING METHOD THEREOF", which is herein incorporated by reference.

Figure 3:
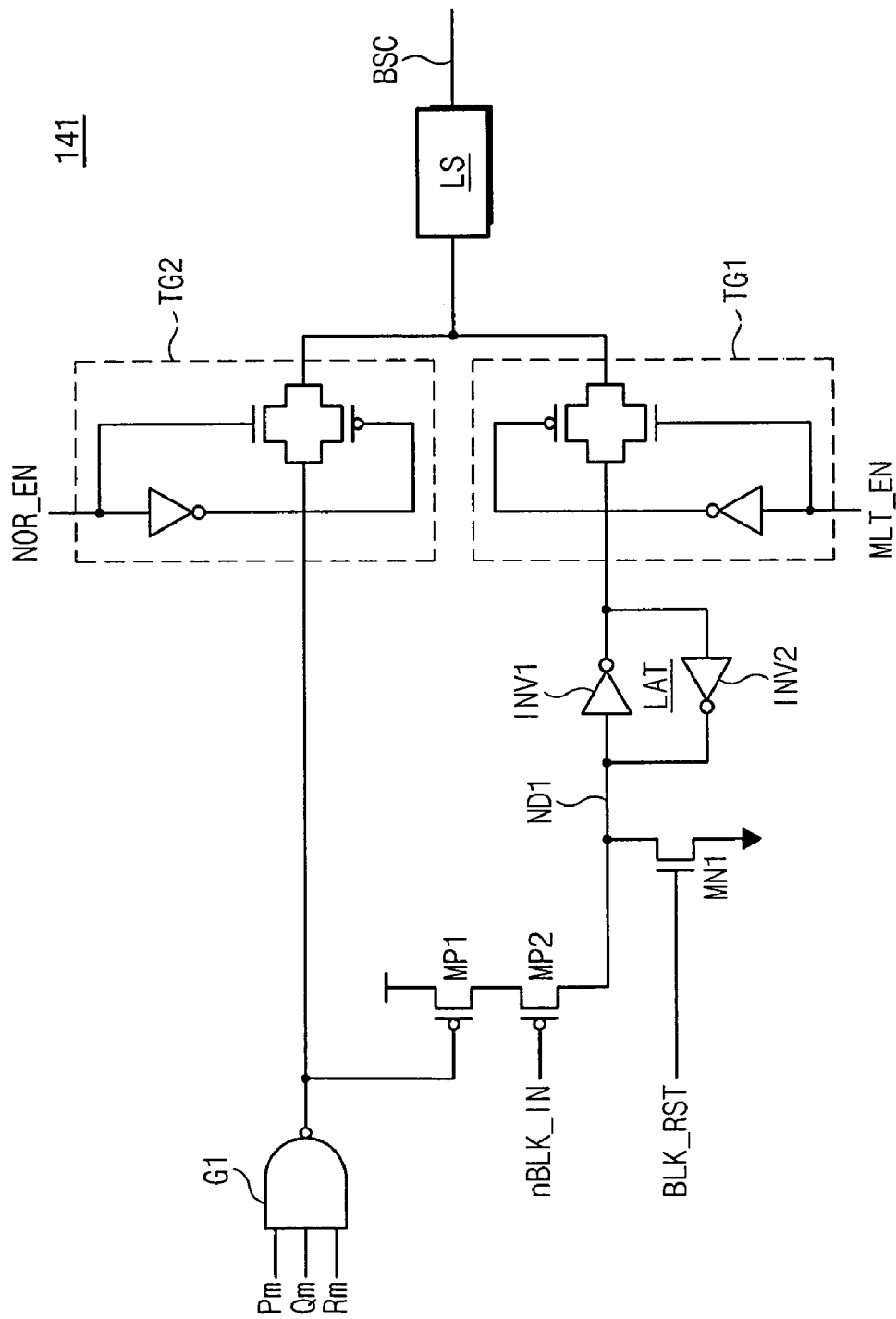
FIG. 3 is a circuit diagram that further illustrates the example block decoder circuit of FIG. 2.
Figure 4:
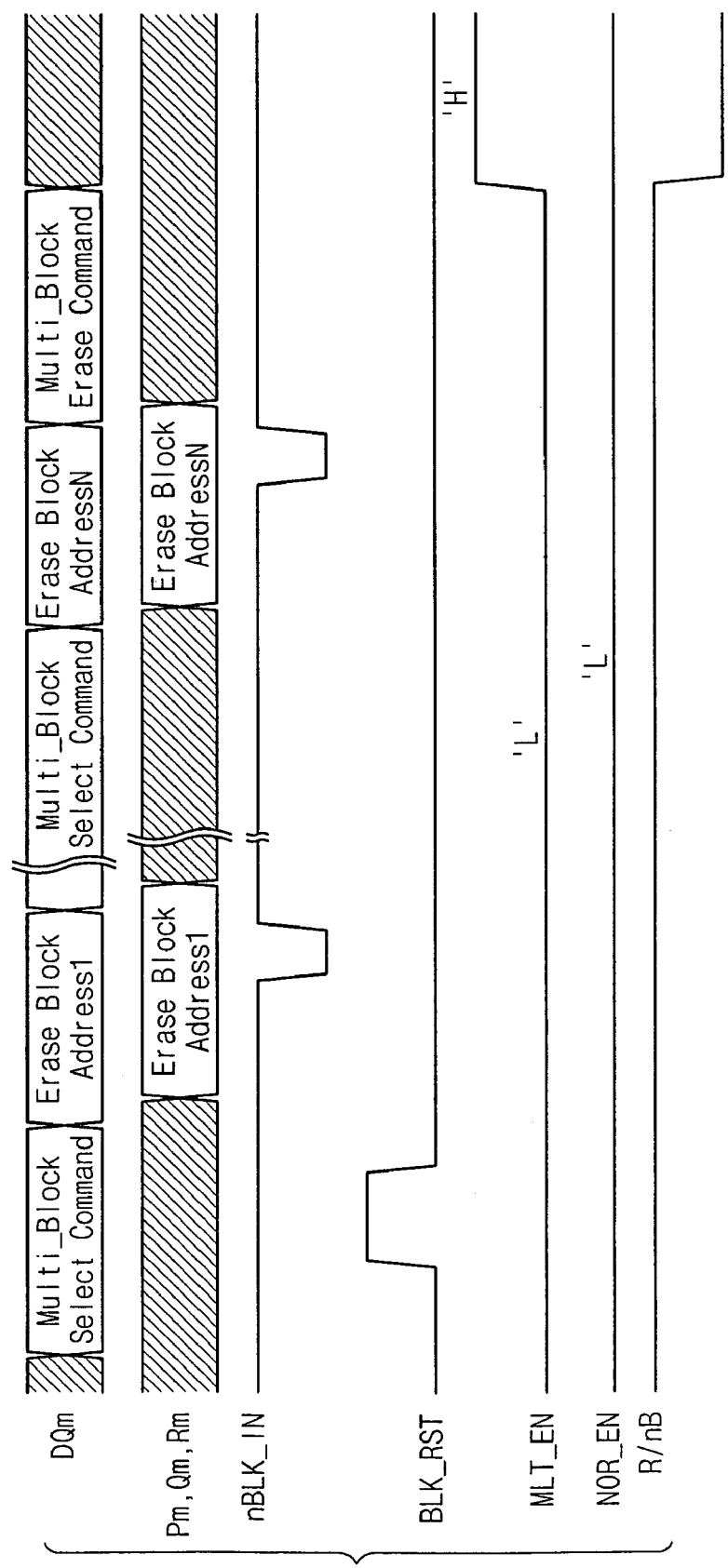
FIG. 4 is a timing diagram illustrating the control signals that may be applied to the block decoder circuit of FIG. 3.

FIG. 3 is a circuit diagram further illustrating the example block decoder of FIG. 2. FIG. 4 is a timing diagram illustrating the control signals that may be applied to the example block decoder of FIG. 3.

Referring to FIG. 3, the block decoder 141 corresponds to a memory block. Block decoders corresponding to other memory blocks may have the same structure as block decoder 141. The block decoder 141 includes a NAND gate G1, PMOS transistors MP1 and MP2, an NMOS transistor MN1, a latch LAT (or a register) consisting of inverters INV1 and INV2, transmission gates TG1 and TG2, and a level shifter LS. Decoded block address signals Pm, Qm, and Rm from the pre-decoder circuit 130 in FIG. 1 are applied to the NAND gate G1. The PMOS transistors MP1 and MP2 are connected in series between the power supply voltage and an input node ND1 of the latch LAT. A gate of the PMOS transistor MP1 is connected to an output terminal of the NAND gate G1, and a gate of the PMOS transistor MP2 is connected to receive a control signal nBLK_IN. The NMOS transistor MN1 is connected between the input node ND1 of the latch LAT and the ground voltage and is controlled by a control signal BLK_RST. The transmission gate TG1 is controlled by the control signal MLT_EN and transfers an output of the latch LAT to the level shifter LS. The transmission gate TG2 is controlled by a control signal NOR_EN and transfers an output of the NAND gate G1 to the level shifter LS. The level shifter LS activates the block select line BSC in response to an input signal. A voltage level of the activated block select line BSC is set to be differently according to modes of operation. For example, a voltage level of the block select line BSC is set such that voltages of the select line S0–Si are transferred to corresponding lines through select transistors ST0–STi in FIG. 2 without a voltage drop. A voltage supplied to the block select line BSC via the level shifter LS is provided from the high voltage generator circuit 220 in FIG. 1.

According to these embodiments, the control signals nBLK_IN, BLK_RST, NOR_EN and MLT_EN are generated by the erase controller circuit 160.

In operation, if a multi-block select command is first received, the erase controller circuit 160 activates the control signal BLK_RST. The NMOS transistor MN1 is turned on by activation of the control signal BLK_RST, so that the latch LAT is reset. At this time, the control signals MLT_EN and NOR_EN are at a low level. This means that the transmission gates TG1 and TG2 are inactivated. Next, a block address is received to select a memory block to be erased. The received block address is decoded by the pre-decoder circuit 130, and the decoded block address signals Pm, Qm, and Rm are provided to the NAND gate G1. When a block address is received, the erase controller circuit 160 activates the control signal nBLK_IN. If the decoded block address signals Pm, Qm, and Rm are all '1', an output of the NAND gate G1 goes low and thus the PMOS transistor MP1 is turned on. Accordingly, when the control signal nBLK_IN is activated, the input node ND 1 of the latch LAT has a low-to-high transition. At this time, since the transmission gates TG1 and TG2 are inactivated, the block select line BSC is not driven by the level shifter LS.

With the above description, if a block address follows a multi-block select command, a received block address is stored in the latch LAT of the block decoder 141 according to the control of the erase controller circuit 160. This operation is repeated until block addresses of memory blocks to be erased are all stored in corresponding block decoders.

Once block addresses of memory blocks to be erased are all stored in corresponding block decoders, the erase controller circuit 160 activates the control signal MLT_EN in response to a multi-block erase command. As the control signal MLT_EN is activated, a value stored in the latch LAT is transferred to the level shifter LS through the transmission gate TG1. The level shifter LS activates the block select line BSC in response to an input signal. At this time, block select lines BSC of only selected memory blocks are activated. Afterwards, selected memory blocks are simultaneously erased in the well-known manner, and an R/nB signal is activated low during the erase time.

In FIG. 3, during a subsequent erase verify period, the control signal NOR_EN is activated while the control signal MLT_EN is inactivated. Accordingly, during the erase verify period, a block select line BSC is directly activated according to an input block address without storing the block address in the latch LAT.

Figure 5:
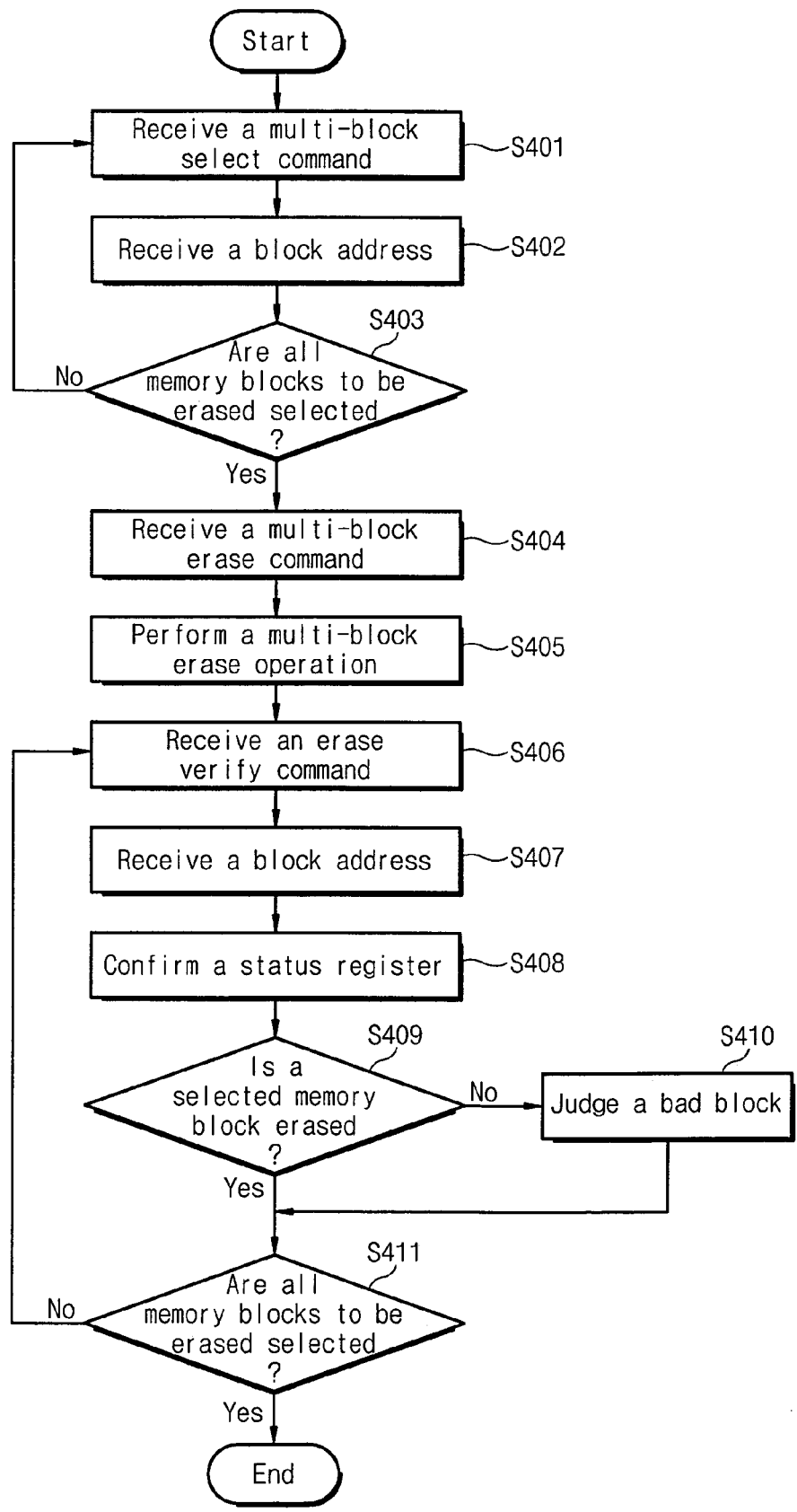
FIG. 5 is a flowchart illustrating a multi-block erase method of a non-volatile semiconductor memory device according to some embodiments of the invention.
Figure 6:
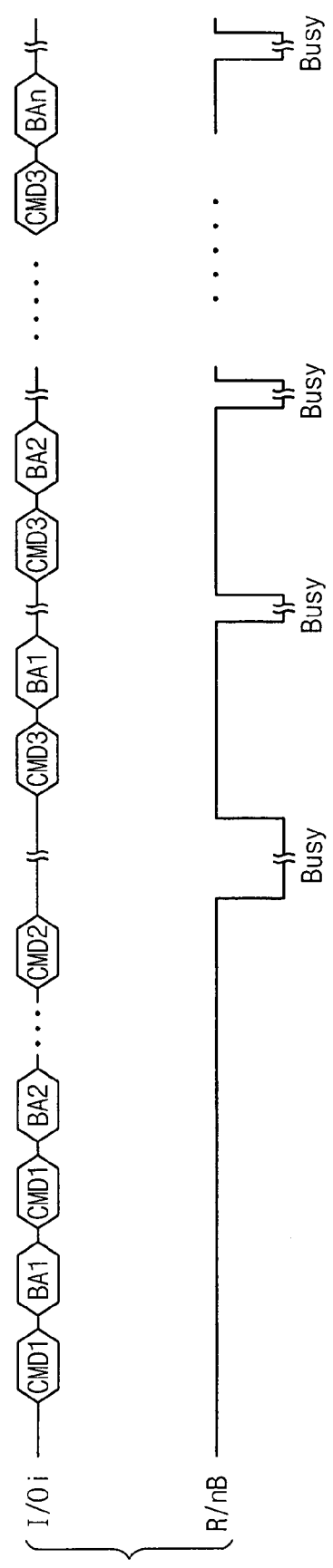
FIG. 6 is a timing diagram illustrating the multi-block erase operation of a non-volatile semiconductor memory device according to some embodiments of the invention.

FIG. 5 is a flowchart illustrating a multi-block erase method of a non-volatile semiconductor memory device according to some embodiments of the invention. FIG. 6 is a timing diagram illustrating the multi-block erase operation of a non-volatile semiconductor memory device according to some embodiments of the invention. Below, a multi-block erase method of a non-volatile semiconductor memory device according to some embodiments of the invention will be described more fully below with reference to accompanying drawings.

Referring to FIG. 5, if a multi-block select command CMD1 is received in process S401, an erase controller circuit 160 activates a control signal BLK_RST so that latches of block decoders 141 are reset. At this time, control signals MLT_EN and NOR_EN are maintained at a low level so that a block select line BSC is not driven by a block address to be received. If a block address BA1 for selecting a memory block to be erased is received in process S402, a pre-decoder circuit 130 decodes the received block address, and the decoded block address signals Pm, Qm, and Rm are applied to a NAND gate G1 of a block decoder 141. When the decoded block address signals Pm, Qm, and Rm all are at a high level, an output of the NAND gate G1 goes to a low level. This turns on a PMOS transistor MP1 of the block decoder 141. At the same time, the erase controller circuit 160 activates a control signal nBLK_IN, so that an input node ND1 of a latch LAT in the block decoder 141 becomes high through PMOS transistors MP1 and MP2. Thus a memory block corresponding to the received block address is selected.

The processes S401 and S402 are repeated until the block addresses of all memory blocks to be erased are received (process S403). If the block addresses of all memory blocks to be erased are received, a multi-block erase command CMD2 is received in process S404. The erase controller circuit 160 activates a control signal MLT_EN in response to the multi-block erase command CMD2. As the control signal MLT_EN is activated, values in latches LAT of block decoders 141 are transferred to corresponding level shifters LS through corresponding transmission gates TG1. Each of the level shifters LS activates a corresponding block select line BSC when its input signal has a low level. Accordingly, only block select lines BSC of memory blocks to be erased are activated. Afterwards, the erase controller circuit 160 controls a row decoder circuit 150 and a high voltage generator circuit 220 so that word lines (or pages) of each of the selected memory blocks are set to the ground voltage and so that the bulks of the selected memory blocks are set to a high voltage. Thus, during process S405, a multi-block erase operation is performed during a given time. At this time, the erase controller circuit 160 activates the R/nB signal low while the multi-block erase operation is performed.

If the multi-block erase operation is ended, the erase controller circuit 160 inactivates the R/nB signal high. After the inactivation of the R/nB signal, an erase verify command CMD3 is provided to the non-volatile semiconductor memory device 100 in process S406. As the erase verify command CMD3 is received, the erase controller circuit 160 activates the control signal NOR_EN high. This enables an output of the NAND gate G1 in the block decoder 141 to be transferred directly to the level shifter LS through the transmission gate TG2. If a block address BA1 for selecting one of the erased memory blocks is received, the pre-decoder circuit 130 decodes the received block address BA1, and the block select line BSC of an erased memory block corresponding to the received block address BA1 is activated by the level shifter LS based on the decoded result. Afterwards, the erase controller circuit 160 controls the row decoder circuit 150 and the high voltage generator circuit 220 so that word lines of the selected memory block are set to the ground voltage.

As the word lines of the selected memory block is set to the ground voltage, bit lines have the ground voltage or the power supply voltage according to whether memory cells of a corresponding string are normally erased. For example, in a case where the memory cells of any string are normally erased, a bit line has the ground voltage. On the other hand, in a case where at least one of memory cells of any string is not erased, a bit line has a precharged voltage by a corresponding page buffer. Page buffers PB of a page buffer circuit 170 latch voltage levels of corresponding bit lines. The latched values nWD0–nWDk are transferred to a pass/fail check circuit 210. The pass/fail check circuit 210 judges whether the values nWD0–nWDk have the same value (for example, a pass data value). The judgment result of the pass/fail check circuit 210 is stored in a status register 161 in the erase controller circuit 160. A result in the status register 161 is externally output through a well-known status read operation in process S408. In process S409, it is determined whether an erase operation of the selected memory block is normally performed, based on the read-out result. If the read-out result indicates that the erase operation of the selected memory block was not performed normally, the selected memory block is classified as a bad block in process S410. Process S411 causes processes S406–S410 to be repeated until an erase verify operation of each of the erased memory blocks is performed.

As understood from the above description, after memory blocks are simultaneously erased, the erase verify operation of each erased memory block is performed according to an erase verify command and a block address that are provided from the external. For example, to select a set of N erased memory blocks, N cycles of an erase command and a block address are externally provided. The erase verify operation is carried out according to the erase verify command and the block address that is received every cycle.

Figure 7:
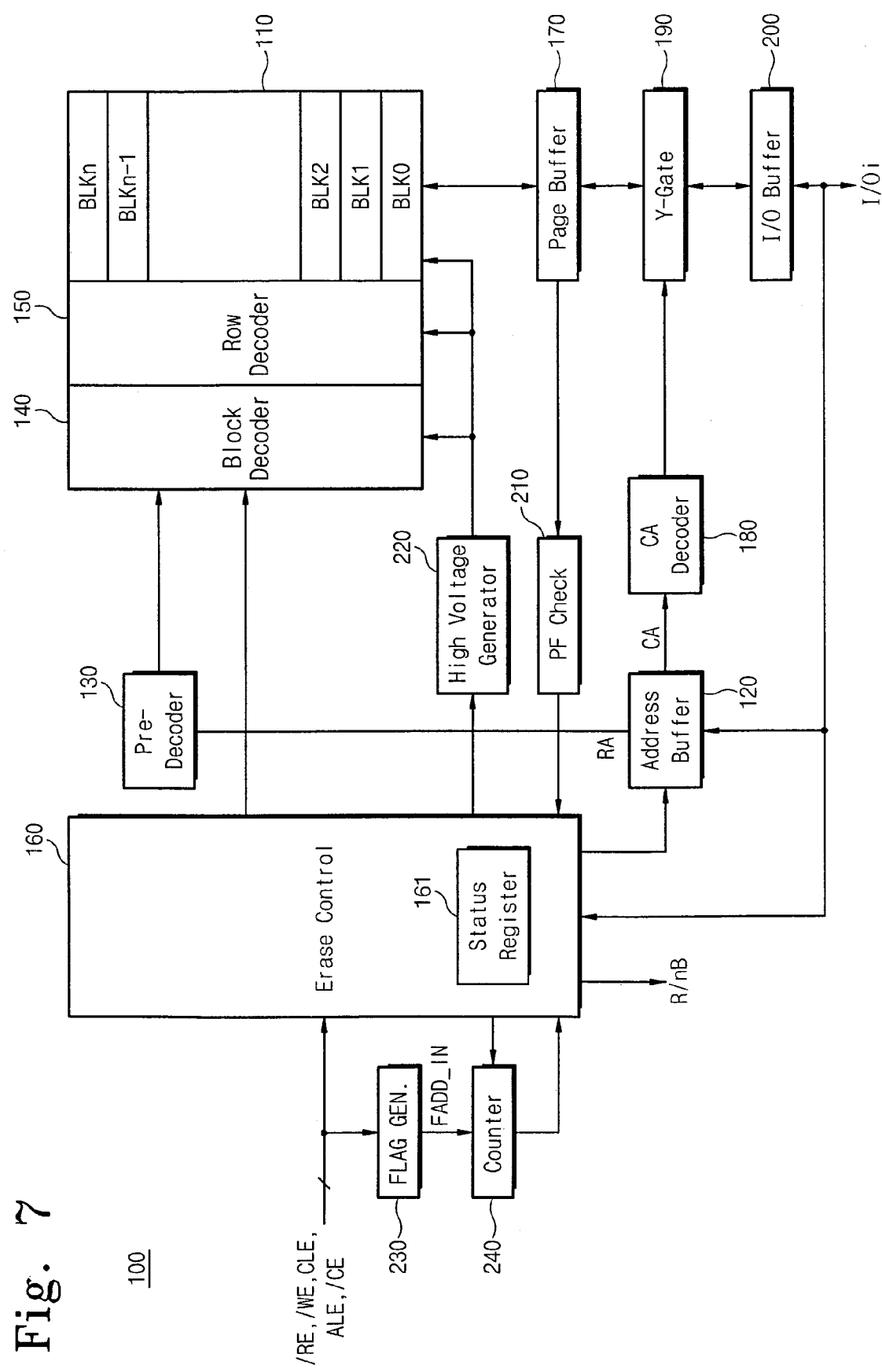
FIG. 7 is a schematic block diagram illustrating a non-volatile semiconductor memory device according to other embodiments of the invention.

FIG. 7 is a schematic block diagram of a non-volatile semiconductor memory device according to other embodiments of the invention. In FIG. 7, elements that are to the same as those in FIG. 1 are marked by the same numerals, and a duplicative description is omitted. The embodiments illustrated in FIG. 7 are the same as the embodiments illustrated in FIG. 1 except that a flag generator circuit 230 and a counter 240 are added.

The flag generator circuit 230 and the counter 240 constitute a judgment circuit for judging the number of memory block to be erased, and an erase controller circuit 160 varies a time needed for a multi-block erase operation in response to the judgment result of the judgment circuit. The flag generator circuit 230 generates a flag signal FADD_IN of a pulse shape informing an input of a block address in response to control signals (e.g., CLE, ALE, /CE, /RE, /WE). For example, when the ALE and /RE signals are at a high level and the CLE and /CE signals are at a low level, the flag generator circuit 230 generates the flag signal FADD_IN in synchronization with a high-to-low transition of the /WE signal. The counter 240 counts a pulsed number of the flag signal FADD_IN and outputs the counted value to the erase controller circuit 160. The counter 240 is reset by the erase controller circuit 160 when a multi-block select command is firstly received. The erase controller circuit 160 controls a time for the multi-block erase operation in response to the counted value. For example, the erase controller circuit 160 controls the high voltage generator circuit 220 according to the judgment result of the judgment circuit, so that a time for applying voltages for the erase operation can be adjusted.

A time for the erase operation is different according to the number of memory blocks to be erased. That is, as the number of memory blocks to be erased is increased, the time for the erase operation becomes longer. As compared with the conventional process where an erase time is maintained constantly regardless of the number of memory blocks to be erased, embodiments of the invention are capable of optimizing a time for the multi-block erase operation by variably controlling the erase time according to the number of memory blocks to be erased.

Figure 8:
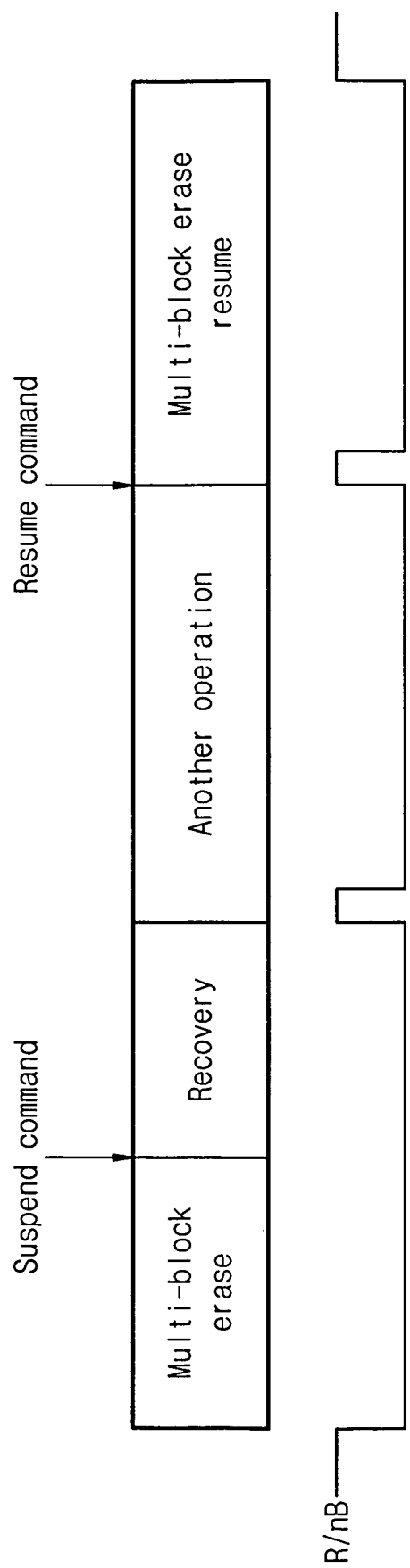
FIG. 8 is a timing diagram illustrating a suspend mode of a non-volatile semiconductor memory device according to some embodiments of the invention.

A non-volatile memory device according to some embodiments of the invention supports a suspend mode. In the suspend mode, a multi-block erase operation is suspended and another operation such as a read operation is carried out. FIG. 8 is a timing diagram illustrating a suspend mode of a non-volatile semiconductor memory device according to some embodiments of the invention.

Referring to FIG. 8, while a multi-block erase operation is performed, a suspend command is provided to the non-volatile semiconductor memory device 100. When the suspend command (for example, B0h) is provided to the memory device 100, an erase control circuit 160 suspends the multi-block erase operation and performs a recovery operation where voltages used for the erase operation are initialized. After the recovery operation is performed during a given time (for example, about 300 microseconds), another operation such as a read operation will be carried out under the control of the erase control circuit 160. Although the multi-block erase operation is suspended, block select information stored in a block decoder circuit 150 is maintained. For this, during another operation, the erase control circuit 160 makes a transmission gate TG1 of a block decoder 141 be turned off and a transmission gate TG2 thereof be turned on. That is, in the case that the multi-block erase operation is suspended, block select information of a memory block to be selected at another operation is transferred to a level shifter LS through a NAND gate G1 and the transmission gate TG2. Afterward, the read operation will be performed in a well-known manner.

Once another operation is completed, a resume command (for example, 30 h) is provided to the memory device 100. The erase control circuit 160 resumes the multi-block erase operation in response to the resume command. The resumed multi-block erase operation is performed according to previously stored block select information, which is accomplished by turning on the transmission gate TG1 of each block decoder 141. The multi-block erase operation is resumed under the control of the erase control circuit 160. Although a read command is received to perform the read operation, the erase control circuit 160 controls the block decoder circuit 140 so that information in a latch of each block decoder 141 is not reset.

Embodiments of the invention may be practiced in many ways. What follows are exemplary, non-limiting descriptions of some embodiments of the invention.

In accordance with some embodiments, a method of erasing a non-volatile semiconductor memory device includes selecting memory blocks to simultaneously erase the selected memory blocks, and performing an erase verify operation for each of the erased memory blocks according to an erase verify command and a block address that are provided from the external. The time needed to erase memory blocks is varied according to the number of the memory blocks that are to be erased.

In accordance with other embodiments of the invention, a non-volatile semiconductor memory device includes a number of memory blocks and an erase controller configured to control a multi-block erase operation where at least two ones of the memory blocks are simultaneously erased. After the multi-block erase operation, the erase controller controls an erase verify operation for each of the erased memory blocks in response to an externally provided erase verify command and a block address. The erase controller includes a status register for storing a result of the erase verify operation. The erase verify result in the status register is externally output before the next erase verify command is received.

In accordance with other embodiments, a non-volatile semiconductor memory device includes a number of memory blocks, a judgment circuit for judging the number of memory blocks to be erased, an erase controller configured to control a multi-block erase operation where at least two ones of the memory blocks are simultaneously erased. The erase controller varies a time for the multi-block erase operation based on a judgment result of the judgment circuit. After the multi-block erase operation, the erase controller controls an erase verify operation for each of the erased memory blocks in response to an externally provided erase verify command and a block address. The judgment circuit includes a flag signal generator for pulsing a flag signal whenever a block address for selecting a memory block to be erased is received and a counter for counting the pulsed number of the flag signal to output a counted value to the erase controller, the erase controller controlling the time for the multi-block erase operation in response to the counted value.

The invention has been described using several exemplary embodiments. However, it is to be understood that the scope of the invention is not limited only to the disclosed embodiments. To the contrary, various modifications and similar arrangements may be made to the embodiments disclosed above that nevertheless fall within the scope of the attached claims.

We claim:

1. A method of erasing a non-volatile semiconductor memory device comprising:
   selecting memory blocks, where selecting memory blocks includes receiving a block address and initializing a register of one of the memory blocks in response to a multi-block select command, storing the block address in the register, and repeating the receiving and storing processes for a different block address until all of the memory blocks are selected;
   simultaneously erasing the memory blocks; and
   performing an erase verify operation for each of the memory blocks according to an erase verify command and a block address that are both externally provided.

2. The method of claim 1, wherein simultaneously erasing the memory blocks comprises simultaneously erasing in response to a multi-block erase command.

3. The method of claim 2, wherein simultaneously erasing the memory blocks further comprises adjusting a time needed to erase the memory blocks in accordance with a quantity of the memory blocks.

4. The method of claim 1, wherein performing the erase verify operation comprises storing a result in a status register.

5. The method of claim 4, wherein performing the erase verify operation further comprises externally outputting information in the status register before a next erase verify command is received.

6. A method of erasing a non-volatile semiconductor memory device comprising:
   erasing memory blocks at the same time, wherein erasing the memory blocks includes receiving a block address in response to a multi-block select command, initializing all registers of block decoders corresponding to the memory blocks when the multi-block select command is received, storing the block address in a register of one of the memory blocks, repeating the receiving and storing steps until all of the memory blocks are selected, and erasing the memory blocks in response to a multi-block erase command;
   selecting one of the memory blocks in response to an externally received block address and in response to an erase verify command;
   verifying whether the one of the memory blocks is normally erased; and
   repeating the selecting and verifying processes until all of the memory blocks have been selected and verified.

7. The method of claim 6, wherein verifying whether the one of the memory blocks is normally erased comprises storing information indicating whether the one of the memory blocks is normally erased in a status register.

8. The method of claim 7, wherein verifying whether the one of the memory blocks is normally erased further comprises externally outputting information in the status register before a next erase verify command is received.

9. The method of claim 6, wherein erasing the memory blocks comprises adjusting a time needed to erase the memory blocks in accordance with a quantity of the memory blocks.

10. A method of erasing a non-volatile semiconductor memory device comprising:
    receiving a block address in response to a multi-block select command;
    initializing all registers of block decoders corresponding to the memory blocks when the multi-block select command is received;
    storing the block address in a register of a memory block to be erased;
    repeating the receiving and storing steps for a remainder of the memory blocks to be erased;
    erasing all of the memory blocks at the same time in response to a multi-block erase command;
    selecting one of the memory blocks in response to an externally received block address and in response to an erase verify command;
    verifying whether the one of the memory blocks is normally erased; and
    repeating the selecting and verifying steps for a remainder of the memory blocks.

11. The method of claim 10, wherein verifying whether the one of the memory blocks is normally erased comprises storing information indicating whether the one of the memory blocks is normally erased in a status register.

12. The method of claim 11, wherein verifying whether the one of the memory blocks is normally erased further comprises externally outputting the information in the status register before a next erase verify command is received.

13. The method of claim 10, wherein erasing all of the memory blocks comprises adjusting a time needed to erase all of the memory blocks according to a quantity of the memory blocks.

14. A non-volatile semiconductor memory device comprising:
    a set of M memory blocks;
    block decoders, each block decoder corresponding to one of the set of M memory blocks, each block decoder comprising a register for storing a corresponding block address;
    an erase controller configured to control a multi-block erase operation that simultaneously erases a subset of N memory blocks out of the set of M memory blocks, the erase controller further configured to control, after the multi-block erase operation, an erase verify operation for each of the subset of N memory blocks in response to an externally provided erase verify command and and in response to one of N externally provided block-addresses, where N is greater than 1 and less than or equal to M ($1 < N \leq M$), the erase controller further configured to control the block decoders during the multi-block erase operation so that block addresses are stored in the block decoders corresponding to the subset of N memory blocks, the erase controller further configured to initialize the register of each block decoder corresponding to the subset of N memory blocks when a first multi-block select command is received.

15. The device of claim 14, wherein the erase controller comprises a status register for storing a result of the erase verify operation.

16. The device of claim 15, wherein the status register is configured to externally output the result before a next erase verify command is received.

17. The device of claim 14, the erase controller further configured to control the block decoders so that the subset of N memory blocks are selected during the erase verify operation without storing block addresses.

18. A non-volatile semiconductor memory device comprising:
    a set of M memory blocks;
    an erase controller configured to control a multi-block erase operation that simultaneously erases a subset of N memory blocks from the set of M memory blocks, N being greater than 1 and less than or equal to M ($1 < N \leq M$), the erase controller configured to vary a time for the multi-block erase operation in response to an output of the judgment circuit, the erase controller further configured to control, after the multi-block erase operation, erase verify operations for subset of N memory blocks in response to an externally provided erase verify command and in response to N externally provided block addresses; and
    a judgment circuit for determining the subset of N memory blocks to be erased, the judgment circuit including a flag signal generator configured to generate a flag signal whenever a block address for one of the subset of N memory blocks is received, the judgment circuit also including a counter configured to count a number of flag signals, and to output the number to the erase controller, the erase controller configured to control the time for the multi-block erase operation in response to the number.

19. The device of claim 18, wherein the flag signal comprises a pulse.

20. The device of claim 18, wherein the erase controller comprises a status register for storing a result of the erase verify operation.

21. The device of claim 20, wherein data in the status register is externally output before a next erase verify command is received.

22. The device of claim 18, further comprising block decoders, each block decoder corresponding to one of the set of M memory blocks.

23. The device of claim 22, wherein the erase controller is configured to control the block decoders at the multi-block erase operation so that block addresses are stored in the block decoders corresponding to the subset of N_memory blocks.

24. The device of claim 23, wherein each block decoder comprises a register for storing a corresponding block address.

25. The device of claim 24, wherein the erase controller is configured to initialize the register of each block decoder corresponding to the subset of N memory blocks when a first multi-block select command is received.

26. The device of claim 18, wherein during the erase verify operation, the erase controller further configured to control the block decoders so that the subset of N memory blocks are selected during the erase verify operation without storing block addresses.

27. A decoder circuit in a non-volatile memory device having memory blocks, the decoder circuit comprising:

a decoder configured to select one of the memory blocks by decoding an address signal to produce a decoded address signal;

a latch configured to latch the decoded address signal; and a switch configured to output either the decoded address signal or a latch output as a block select signal, the block select signal selected according to a mode of operation.

28. The decoder circuit of claim 27, the latch configured to latch the decoded address signal during a multi-block erase operation.

29. The decoder circuit of claim 27, the switch configured to select the latch output during a multi-block erase operation and configured to select the decoded address signal during an operation that is different from the multi-block erase operation.

30. The decoder circuit of claim 27, the switch configured to block the latch output and select the decoded address signal when a suspend command is received.

31. The decoder circuit of claim 30, the switch configured to select the latch output and block the decoded address signal in response to a resume command that signals the resumption of the multi-block erase operation.

* * * * *